United States Patent [19]

Mayer et al.

[11] Patent Number: 5,497,019

[45] Date of Patent: Mar. 5, 1996

[54] SILICON-ON-INSULATOR GATE-ALL-AROUND MOSFET DEVICES AND FABRICATION METHODS

[75] Inventors: Donald C. Mayer, Palos Verdes; Kenneth P. MacWilliams, Redondo Beach, both of Calif.

[73] Assignee: The Aerospace Corporation, El Segundo, Calif.

[21] Appl. No.: 310,915

[22] Filed: Sep. 22, 1994

[51] Int. Cl.$^6$ .................................................. H01L 21/70
[52] U.S. Cl. .......................... 257/347; 257/365; 257/401; 257/506
[58] Field of Search ............................. 257/57, 349, 365, 257/347, 350, 401, 506

[56] References Cited

U.S. PATENT DOCUMENTS

| 4,980,308 | 12/1990 | Hayashi et al. | 257/349 |
| 5,188,973 | 2/1993 | Omura et al. | 257/347 |

OTHER PUBLICATIONS

Modes of Operation and Radiation Sensitivity of Ultrathin SOI Transistors Mayer, D. C., IEEE Trans. Electron Devices.

A Fully Depleted Lean-Channel Transistor (DELTA)—A Novel Vertical Ultra Thin SOI MOSFET Hisamoto, D., Kaga, T., Kawamoto, Y., Takeda, E.—IEDM Tech Digest.

Silicon-On-Insulator Gate-All-Around Device Colinge, J. P., Gao, M. H., Romano-Rodriguez, A., Maes, H., Claeys, C. IEDM Tech Digest.

Radiation Effects in Gate-All-Around Structures Lawrence, R. K., Colinge, J. P., Hughes, H. L., 1991 IEEE Int'l SOI Conf.

C.M.O.S. Devices Fabricated on Buried $SiO_2$ Layers Formed by Oxygen Implantation Into Silicon Izumi, K., Doken, M., Ariyoshi, H., Electronics Letts. 14.

Formation of Multiply Faulted Defects in Oxygen Implanted Silicon-on-Insulator Material Visitserngtrakul, S., Krause, S. J.,—J. Aool. Phys. 69.

A Field Assisted Bonding Process for Silicon Dielectric Isolation Frye, R. C., Griffith, J. E., Wong, Y. H., J Electrochem. Soc. 133.

Silicon-On-Insulator by Bonding and Etch-Back Lasky, J. B., Stiffler, S. R., White, F. R., Abernathey, J. F. IEDM Tech. Digest, 1985.

Bonding of Silicon Wafers for Silicon-On-Insulator Maszara, W. P., Goetz, G., Caviglia, A., McKitterick, J. B. J. Appl. Phys. 64.

VLSI SOI Fabrication by SIMOX Wafer Bonding (SWB) Tong, Q. Y., Gosele, U., 1992 IEEE Int'l SOI Conf. Proc., 1992.

Dual-Gate SOI CMOS Technology by Local Overgrowth (LOG) Zingg, R. P., Hofflinger, B., Neudick, G. W., 1989 IEEE SOS/SOI Tech Conf. Proc., 1989.

Dual Gate Operation and Volume Inversion in n–Channel SOI MOSFETs Venkatesan, S., Neudeck, G. W., Pierret, R. F., IEEE Electron Device Letts. 13.

Primary Examiner—Donald L. Monin, Jr.
Attorney, Agent, or Firm—William J. Burke; Derrick M. Reid

[57] ABSTRACT

A gate-all-around (GAA) metal-oxide-semiconductor field-effect transistor (MOSFET) includes a source, channel and drain surrounded by a top gate and a buried bottom gate, the latter of which also has application for other buried structures and is formed on a bottom gate dielectric which was formed on source, channel and drain semiconductor layer. After forming a planar bottom insulator layer on the bottom gate and bottom gate dielectric, the device is flip-bonded to an oxide layer of a bulk silicon wafer, thereby encapsulating the buried bottom gate electrode in insulating oxide. The semiconductor layer forms the source, drain and channel in a mesa structure on which is deposed a top gate dielectric, a top gate, and top gate insulator as well as four conductors for connecting to the source, drain, top gate and bottom gate. The latter two electrodes can be independently controlled or commonly controlled for enhanced operation of GAA MOSFET having improved isolation and reduced parasitic capacitance due to the use of encapsulating insulation layers of the merged wafer consisting of two bonded wafers.

6 Claims, 4 Drawing Sheets

SILICON-ON-INSULATOR GATE-ALL-AROUND MOSFET DEVICES AND FABRICATION METHODS

STATEMENT OF GOVERNMENT INTEREST

The invention was made with Government support under Contract No. F04701-88-C-0089 awarded by the Department of the Air Force. The Government has certain rights in the invention.

FIELD OF THE INVENTION

This invention relates to the class of transistors called metal-oxide-semiconductor field-effect transistors (MOSFETs) and more particularly to MOSFETs formed in semiconductor layers on insulated substrates of a silicon-on-insulator (SOI) wafer, and more particularly to the class of SOI MOSFETs formed with gate electrodes at the top and bottom of the semiconductor layer substantially forming gate-all-around (GAA) MOSFETs, hereinafter referred to as SOI GAA MOSFETs.

BACKGROUND OF THE INVENTION

The general problem to which this invention is addressed is the improvement in performance and reliability of the SOI MOSFET, which is the active element common to many microelectronic circuits. A conventional MOSFET operates by driving current through the channel region between the source and drain of the device. The conductivity of the channel region is modulated by the application of a voltage on the conducting gate above the channel surface and insulated from it. Efforts are ongoing within many MOS integrated circuit manufacturing companies as well as at many universities and government laboratories to improve the speed and available drive current of the SOI MOSFET, to reduce its power consumption, and to improve its reliability and radiation hardness for applications in harsh or remote environments, including space.

Silicon-on-insulator (SOI) is the generic term describing those technologies in which the MOSFETs or other active devices are built in a thin film of silicon over an insulating layer or substrate. The presence of the insulator reduces the parasitic capacitances in the MOSFET compared to a bulk silicon device, resulting in inherent improvements in the speed and power dissipation of MOS integrated circuits, as well as improved immunity to single-event upset of MOS memory elements in a radiation environment. However, the presence of the back interface in the SOI MOSFET can lead to failure of the integrated circuit in a radiation environment caused by charging of the silicon/insulator interface by radiation-induced interface states or fixed charges at this interface (D. C. Mayer, Modes of Operation and Radiation Sensitivity of Ultrathin SOI Transistors, IEEE Trans. Electron Devices, 37, 1280, 1990).

The SOI gate-all-around (GAA) MOSFET, has been described and fabricated to improve the performance of the SOI MOSFET. (D. Hisamoto et al., A Fully Depleted Lean-Channel Transistor (DELTA)—A Novel Vertical Ultra Thin SOI MOSFET, IEDM Tech. Digest, 833 (1989), and J. P. Colinge et al., Silicon-on-Insulator Gate-All-Around Device, IEDM Tech. Digest, 595, 1990). By placing an active gate at the bottom of the SOI device, this bottom active gate creates an enlarged channel of the MOSFET and thereby contributes to the drive current by adding a back surface current to the device front surface current created by the top active gate. Furthermore, by removing the back interface as a potential parasitic failure site in the device, the SOI GAA MOSFET has also demonstrated improved radiation hardness (R. K. Lawrence and H. L. Hughes, Radiation Effects in Gate-All-Around Structures, 1991 IEEE International SOI Conf. Proc., 80, 1991).

In previous methods of fabricating the SOI GAAMOSFET, the process required etching a tunnel beneath a SOI island, oxidizing the bottom of the island, and refilling the tunnel with polysilicon gate material. These procedures are not standard in MOSFET processing and are difficult to implement and control. This prior technique also leaves a very thin oxide layer between the bottom polysilicon gate and the wafer substrate, which increases the capacitive coupling between the bottom gate and the substrate. The capacitive coupling can reduce the speed of the device and create a reliability problem associated with degradation of the thin oxide. Additionally, in the conventional GAA process, the bottom surface of the mesa is defined and delineated by the Separation by Implanted Oxygen (SIMOX) process which uses an energetic oxygen implant and high-temperature anneal (K. Izumi et al., CMOS Devices Fabricated on Buried $SiO_2$ Layers Formed by Oxygen Implantation into Silicon, Electronics Letts. 14, 593, 1978). This method of creating an oxide/silicon interface is known to generate a higher number of defects at the interface than would a conventional thermal oxidation, (S. Visitserngtrakul et al., Formation of Multiply Faulted Defects in Oxygen Implanted Silicon-on-Insulator Material, J. Appl. Phys. 69, 1784 1991). These residual defects can degrade the quality and reliability of the subsequent bottom gate oxide in the conventional GAA process.

Well known SOI processes, such as SIMOX and BESOI wafer processing, bonding and layer etching techniques are available, but have not been used to form GAA MOSFET devices. Such processes, as described for example in R. C. Frye et al., "A Field Assisted Bonding Process for Silicon Dielectric Isolation," J. Electrochem. Soc. 133, 1673 (1986), J. B. Lasky et al., "Silicon-on-Insulator by Bonding and Etch-Back," IEDM Tech. Digest, 684 (1985), W. P. Maszara et al., "Bonding of Silicon Wafers for Silicon-on-Insulator," J. Appl. Phys. 64, 4943 1988, and Q. Y. Tong and U. Gosele, "VLSI SOI Fabrication by SIMOX Wafer Bonding (SWB)", presented at 1992 IEEE International SOI Conference, Ponte Vedra Beach, Fla., October 1992, can be used to form SOI MOSFETs and can be used to form some of the structural components of GAA MOSFETs, but cannot by themselves form GAA MOSFETs. Thus, prior methods of forming SOI GAA MOSFETs involved etching a cavity in the buried oxide under the bottom of the MOSFET, oxidizing the bottom of the device, and filling the cavity with polysilicon to form the bottom gate. These techniques are difficult to control and prevent the GAA device from being formed by conventional MOS fabrication methods. These and other disadvantages are solved or reduced using the present invention.

SUMMARY OF THE INVENTION

An object of the present invention is to provide a Gate All Around (GAA) MOSFET.

Another object of the present invention is to provide a GAA MOSFET having at least a top and bottom gate both for controlling conduction through a channel disposed therebetween.

Another object of the present invention is to form a GAA MOSFET using Silicon On Insulator (SOI) wafer.

Yet another object of the present invention is to form a MOSFET having at least a top and bottom gate both for controlling conduction through a channel disposed therebetween using an SOI wafer having one of said gate insulated therein.

Yet a further object of the invention is to form a MOSFET having at least a top and bottom gate both for controlling conduction through a channel disposed therebetween using an SOI wafer having the bottom gate of said gate insulated therein flip-bonded onto a bulk silicon wafer for burying the bottom gate within a merged bonded wafer consisting of the SOI wafer and bulk silicon wafer.

Still another object of the present invention is to provide a merged bonded wafer including a bulk silicon wafer and a flip bonded SOI wafer having at least one buried electrode.

The present invention takes advantage of SOI wafers, bulk silicon wafers and conventional processing techniques in new methods to form a novel SOI GAA MOSFET structure. The method for forming a flip-bonded SOI GAA-MOSFET described herein employs conventional MOS processing steps in combination with well-established SOI techniques. By forming in sequence a bottom gate dielectric layer, a bottom gate electrode and a bottom gate insulator on an SOI wafer, which is then flip bonded onto a bulk silicon wafer having a bulk silicon insulator layer, the bottom gate electrode is thus buried in a merged wafer comprising the processed flip-bonded SOI wafer and bulk silicon wafer.

One novel aspect of the present invention is the formation of the bottom gate of the GAA MOSFET device on an SOI wafer before the bottom gate dielectric field oxide layer is formed. This allows a conventional, controllable, high-quality gate dielectric formation upon the bottom gate in a GAA MOSFET. The thickness of the integral insulator layer between the bottom gate and the bulk silicon substrate is determined independently by the thicknesses of the bulk silicon insulator layer and a bottom gate insulator layer. The present invention allows the bottom gate to be formed using conventional, reliable gate dielectric and polysilicon deposition techniques.

The present invention enables the GAA MOSFET device to be manufactured using only established process techniques that have been used in the past to construct bulk, SIMOX, or BESOI MOSFETs. The present invention has the additional advantage of allowing an arbitrarily thick oxide buried insulating layer between the polysilicon bottom gate and the bulk silicon substrate, thereby minimizing the parasitic capacitance and ensuring reliable isolation between the bottom gate and the bulk silicon substrate. The present invention forms the bottom gate dielectric, bottom gate electrode, and the bottom gate insulator layer of the MOSFET on an SOI wafer before flipping the SOI wafer upside-down and bonding it to a bulk silicon wafer using conventional bond-and-etch-back SOI (BESOI) techniques.

When the processed SOI wafer is flipped and bonded to the bulk silicon wafer forming a merged wafer, the bulk insulator layer formed on bulk silicon wafer and the bottom gate insulator layer formed over the polysilicon bottom gate electrode of SOI wafer are merged together as a thick oxide buried insulating layer of the merged wafers. After the SOI wafer is flipped and bonded to the bulk silicon wafer, the SOI substrate and SOI buried insulator layer are then stripped from SOI wafer to expose the SOI semiconductor layer. The remaining MOSFETs structures are formed as a mesa superstructure on the merged wafer by conventional mesa etch and polysilicon gate processes. First, the exposed SOI semiconductor layer is etched and processed to define the drain, source and channel conducting regions upon which is then deposited a top gate dielectric. Next, a patterned conductive polycrystalline silicon layer is deposited, defined, and etched to become the top gate electrode on mesa superstructure of the merged wafer. The top gate electrode of the MOSFET and metal connections to the source, drain, and top and bottom gates are then formed using conventional MOS processing techniques.

Any SOI process may be used to form the SOI wafer. The present invention takes advantage of the buried oxide insulator layer of the SOI wafer as an etch-stop for the removal of the SOI substrate and SOI buried oxide insulator layer of the SOI wafer after the flip-bonding process to expose the SOI semiconductor layer. Bonding of SOI wafers may apply known SIMOX wafer bonding processes and allows conventional BESOI processing to define the thin active silicon layer. Conventional BESOI processes have traditionally used a doped silicon layer as the silicon etch stop which makes the uniformity of the silicon layer thickness difficult to control and restricts the silicon film to thicknesses greater than three microns. The SOI wafer bonding and oxide insulator layer etch stop technique allows for a very thin, less than one-tenth micron, silicon layer to be formed, which, when combined with bottom gate formation described in this invention, enables the SOI GAA MOSFET to operate in its fully-depleted mode, thereby allowing maximum current drive at the top and bottom surfaces and body of the channel of the MOSFET. These and other advantages will become more apparent from the following detailed description of the preferred embodiment.

DETAILED DESCRIPTION OF THE PREFERRED EMBODIMENT

Figure 1:
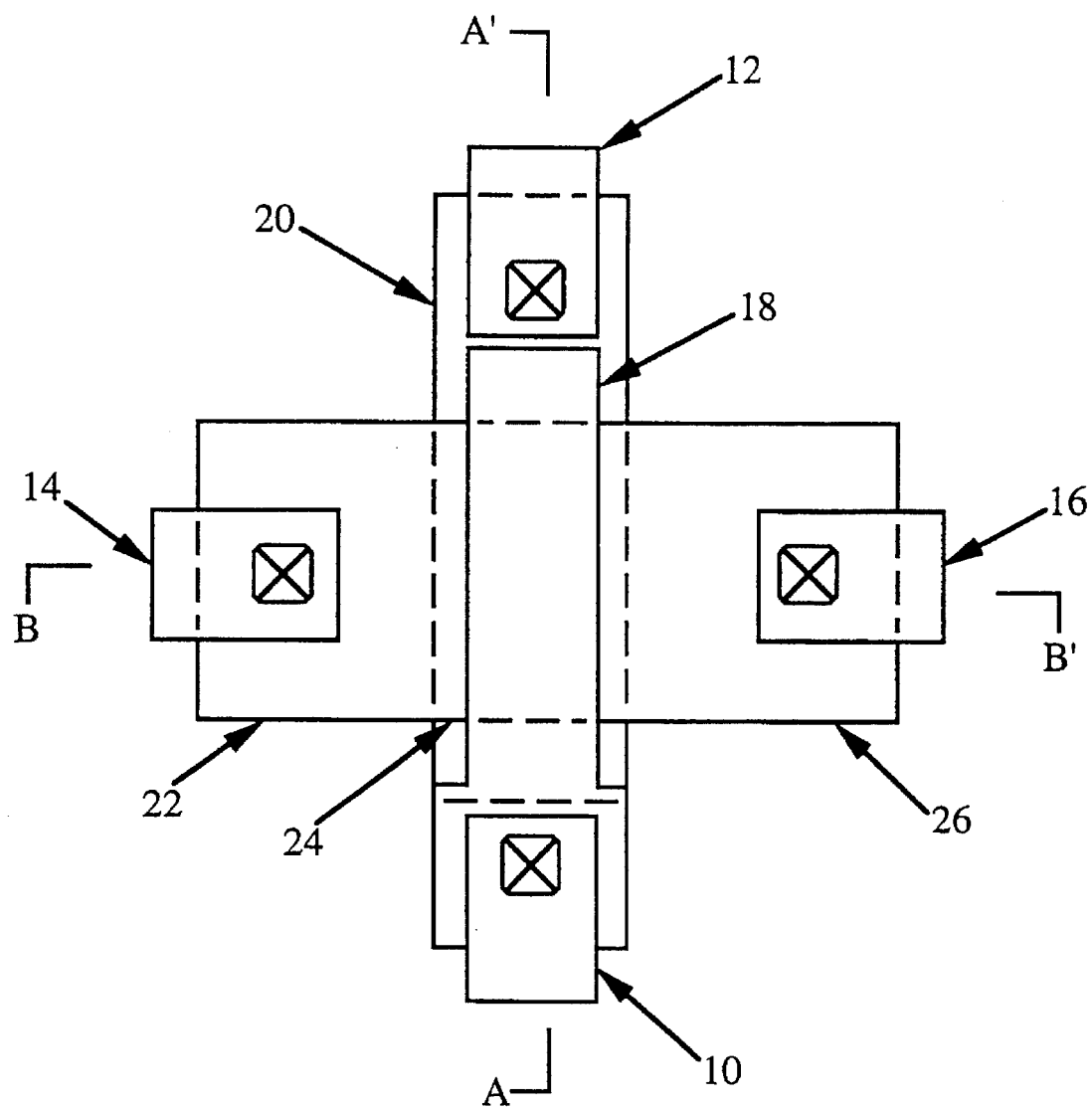
FIG. 1 is a top view of a flip-bonded SOI GAA MOSFET.

Referring to FIG. 1, a top view is shown of Gate-All-Around (GAA) MOSFET having a top gate conductor 10, a bottom gate conductor 12, a drain conductor 14 and a source conductor 16. The conductors 10, 12, 14 and 16 are used to connect the GAA MOSFET to external circuits. The MOSFET further includes a top gate electrode 18 and bottom gate electrode 20 respectively connected to conductors 10 and 12. The active regions of the GAA MOSFET include a drain region 22, a channel region 24 and a source region 26. The drain region 22 and the source region 26 are connected to conductors 14 and 16, respectively. The active regions 22, 24 and 26 are integrally formed together as shown with the channel region being defined as that portion 24 generally disposed directly between the bottom gate electrode 20 and the top gate electrode 18.

Figure 2:
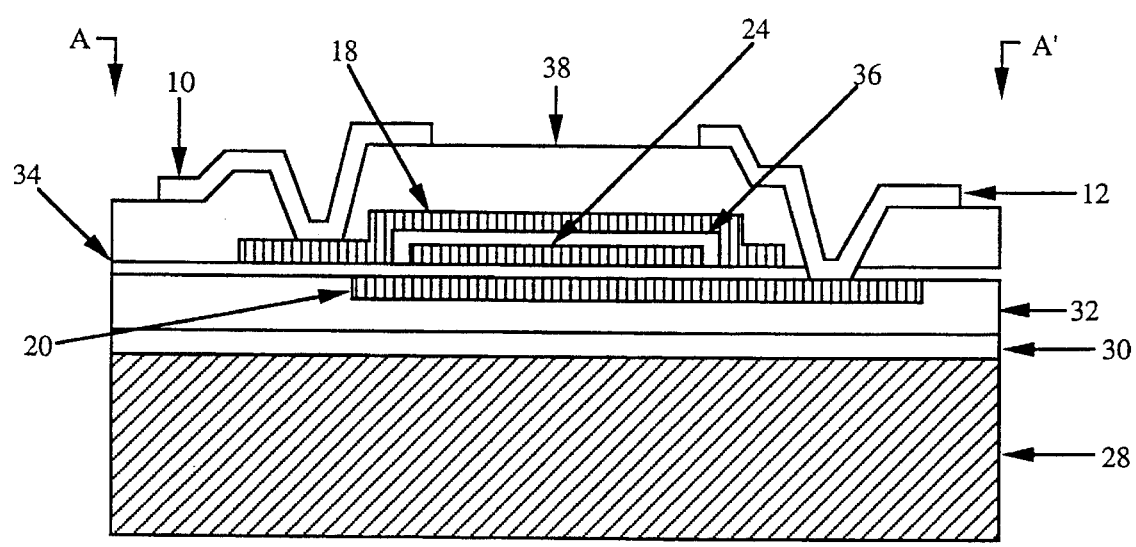
FIG. 2 is a cross-sectional view of the flip-bonded SOI GAA MOSFET as defined by a A—A' plane shown in FIG. 1.
Figure 3:
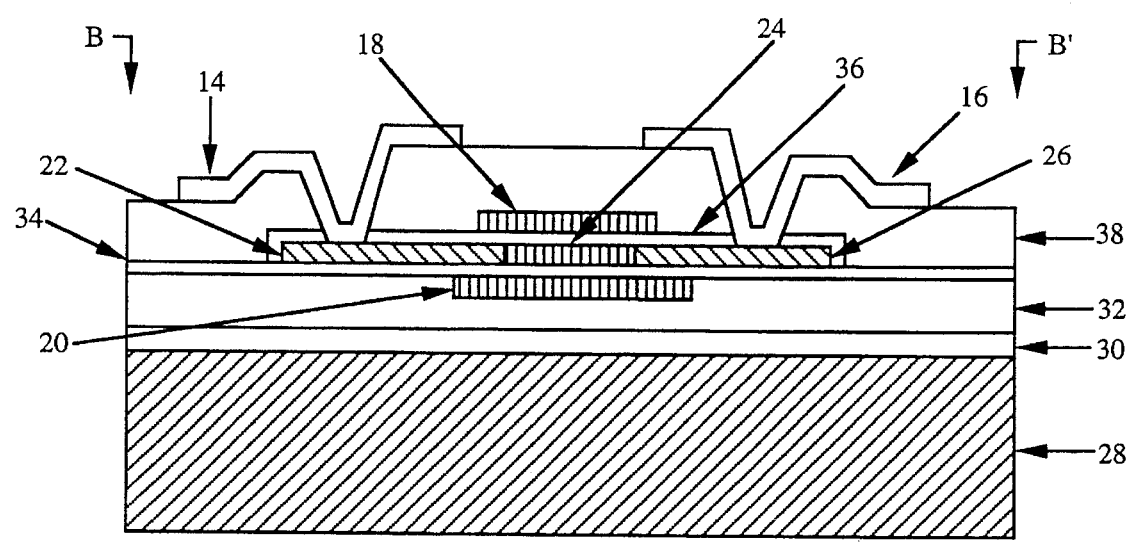
FIG. 3 is a cross-sectional view of the flip-bonded SOI GAA MOSFET as defined by a B—B' plane shown in FIG. 1.

FIGS. 2 and 3 show side sectional views of the GAA MOSFET shown in FIG. 1 which also depicts conductors 10, 12, 14 and 16, gate electrodes 18 and 20, and regions 22, 24 and 26. As shown, the GAA MOSFET is generally disposed on a substrate 28 with a thick oxide insulating layer which, in the preferred form of the invention, includes insulator layers 30 and 32. As shown, the bottom gate electrode is separate from the regions 22, 24 and 26 by a gate dielectric 34 which is also an insulating layer. The bottom gate electrode is encapsulated within insulating materials, and preferably oxide insulators of layers 30, 32 and 34, excepting for the electrical contact to the bottom gate conductor 12. The insulating layers 30 and 32 provide insulation of the GAA MOSFET from the substrate 28 without the need of lateral isolation wells, not shown, which may otherwise be used to electrically isolate the GAA MOSFET from surrounding circuits. The regions 20, 22 and 24 are likewise separated from the top gate electrode 18 by a top gate dielectric 36 preferably and generally formed in a mesa processing configuration as shown. The GAA MOSFET lastly includes a top gate insulating layer 38 which is disposed over the entire GAA MOSFET save the etch windows shown by the penetration of the conductors 10, 12, 14 and 16 to the top gate 18, bottom gate 20, drain region 22 and source region 26, respectively. As shown, the bottom gate conductor 12 penetrates the bottom gate dielectric 34 to connect to the bottom gate electrode 20. As shown, both the drain conductor 14 and the source conductor 16 penetrate the top dielectric 36 to respectively connect to the drain region 22 and source region 26. As shown, the top gate conductor 10 only penetrates the top gate insulator layer 38 to connect to the top gate 18.

The hereinabove GAAMOSFET has advantages in structure. The GAAMOSFET has two separated gate electrodes 18 and 20 which may be controlled separately by separately electrically connecting and controlling gate conductors 10 and 12, or controlled commonly by connecting together the gate conductors 10 and 12, for flexible electronic use of the MOSFET.

The GAA MOSFET is substantially a gate all around device having gate electrodes substantially surrounding the channel region 24 on the top, sides and bottom of the channel region. The GAA MOSFET device is not a true GAA device by virtue of the bottom gate dielectric 34 separating the top and bottom gate electrodes 18 and 20, as shown. However, due to the planar geometry of the gate electrodes 18 and 20, vis-a-vis the planar geometry and relative position of the channel region 24, the GAA MOSFET device is effectively and essentially a GAA MOSFET as the bottom gate electrode 20 and top gate electrode 18 both are used to create surface conduction through the channel 24 between the source 26 and drain 22 along the top, bottom, and side surfaces of the channel 24 to enable the device to be operated with minimum loss of effect due to the separation of the gate electrodes 20 and 18 by the bottom gate dielectric 34 as shown. The GAA MOSFET device could be made to be a true GAA device, but that would necessarily require a common connection between the top and bottom gate electrode 18 and 20, and is thus not preferred so as to save the independent control of the top and bottom gate electrodes. However, before defining the top gate electrode 18, windows, not shown, in the bottom dielectric 34 could be made so that top gate electrode 18 connects directly to the bottom gate electrode 20 through such windows to create a true GAAMOSFET device, which is not preferred as effectively unnecessary. In such a true GAAMOSFET a thin native oxide layer would exist on the bottom gate electrode 34 when exposed to oxygen as in air preventing ideal connectivity between polysilicon gate electrodes 18 and 20 as shown.

Further still, the GAA MOSFET is substantially completely electrically isolated from surrounding circuits and from the substrate 28 by virtue of the insulator layers 30, 32, 34, 36 and 38. Moreover, the GAA MOSFET has reduced parasitic capacitance to the substrate 28 by virtue of a relatively thick oxide insulator consisting of insulating layers 30 and 32. Further, the GAA MOSFET device may be fabricated using conventional MOSFET and integrated circuit manufacturing processes in a new and novel way as hereinbelow preferably set forth.

Figure 4A:
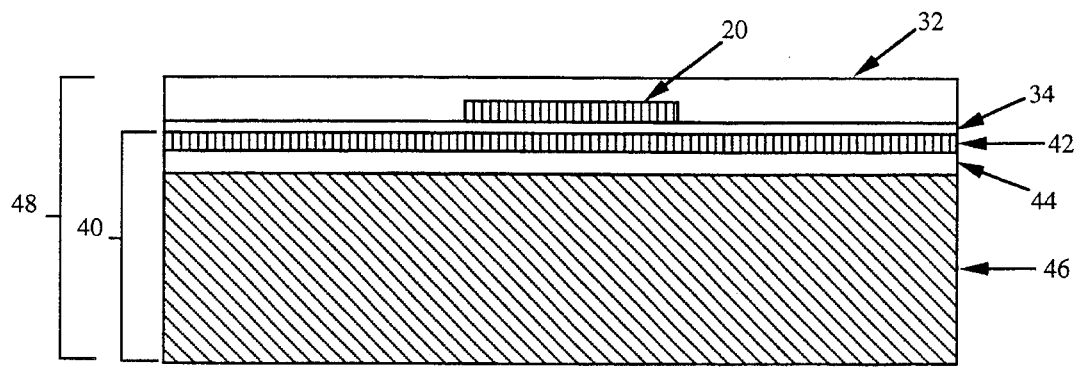
FIG. 4a is a cross-sectional view of a processed SOI wafer formed to include a superstructure having a buried gate.
Figure 4B:
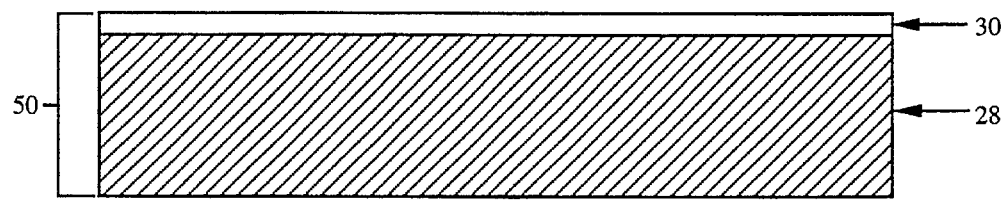
FIG. 4b is a cross-sectional view of a bulk silicon wafer including a bulk insulation layer and a bulk substrate layer.
Figure 4C:
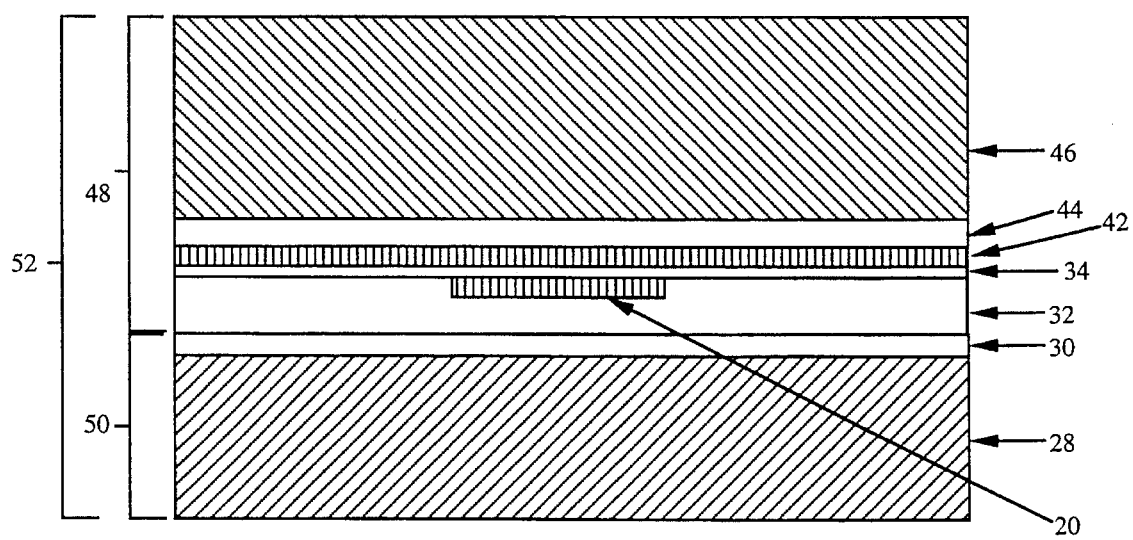
FIG. 4c is a cross-sectional view of a flip-bonded merged wafer including the processed SOI wafer flipped and bonded onto the bulk silicon wafer.

Referring to all the Figures, and particularly FIGS. 4a, 4b and 4c, the GAA MOSFET is preferably fabricated using a series of process steps, starting with silicon-on-insulator wafer 40 having an SOI semiconductor layer 42, an SOI buried insulator layer 44 and an SOI substrate 46. The drain, source and channel regions 22, 26 and 24, repectively, are formed in the silicon semiconductor layer 42 having a predetermined conductivity typically from a predetermined dopant concentration. The layer 42 may be processed, using for example, ion implantation, to define the source and drain regions 26 and 22, respectively, to thereby define the channel region 24. This process step is preferably done at a later stage in the process, and therefore the layer 42 preferably remains as 28 a layer of uniform semiconductor material. The layer is preferably made of silicon, but any suitable semiconductor may be used on the insulating layer 44.

The bottom gate dielectric 34 is formed over semiconductor layer 42 preferably including the source, channel and drain regions 26, 24 and 22, respectively, but particularly the channel region 24. The top and bottom gate electrodes 18 and 20 are made from conductive material, preferably a polycrystalline silicon (polysilicon). The bottom gate electrode 20 is formed on the bottom gate dielectric 34 over the channel region 24. Next, the bottom gate insulator layer 32 is formed over the bottom gate electrode 20 as well as the bottom gate dielectric 34. The exposed insulator layer 32 is planarized using convention planarized processing methods to form a substantially exposed flat surface resulting in a processed SOI wafer 48 including layers 32, 34, 42, 44 and 46 and the bottom gate electrode 20. The processed SOI wafer 48 may be further processed at this time, but preferably not, to remove the SOI substrate 46 and SOI insulator layer 44 from the processed SOI wafer 48.

A bulk silicon wafer 50 consists initially of only a substrate 28. The bulk silicon insulator layer 30 is formed on the bulk silicon substrate 28. The processed SOI wafer 48 is flipped and its exposed planarized surface of the bottom gate insulator layer 32 is bonded to the bulk silicon insulator layer 30 of the bulk silicon wafer using well known prior art bonding techniques, to form a merged wafer 52 as shown in FIG. 4C comprising the bulk silicon wafer 50 and the processed SOI wafer 48. In one embodiment of the invention, the merged wafer 52 essentially provides a buried conducting material, preferably a polysilicon material, encapsulated in an insulating material, preferably an oxide insulating material. The buried conductor material is preferably a buried bottom gate electrode 20, but which may be formed as another circuit structure, such as a buried conductor, not shown, for connecting together subsurface circuits, such as other surface MOSFETs, also not shown. Thus, this embodiment of the invention enables the creation of patterned conducting layers by repeated processes creating for example buried etch runs in a semiconductor wafer similar to prior art hybrid electronics or printed circuit boards having multiple etch run layers for routing to integrated circuit chips or integrated circuit packages, respectively.

The SOI substrate 46 and the SOI insulator 44 of the processed SOI wafer 48 are now preferably removed, exposing the silicon semiconductor layer 42. The SOI insulator 44 functions as an etch stop during removal of the SOI substrate 46. The exposed semiconductor layer 42 of the merged wafer 52 becomes a top surface for further processing similar to conventional and well known MOSFET mesa processes. Processing is now preferably performed to define the transistor mesa by etching the semiconductor layer 42 as an initial mesa formation step. The top gate insulator 36 is then formed, for example, by partial thermal oxidation of the semiconductor layer 42. The top gate electrode 18 is then formed, for example, by polysilicon deposition and etching. The drain and source regions 22 and 26, with enhanced conductivity, are then defined preferably by ion implantation at a predetermined concentration. Alternatively, the mesa formation of the semiconductor layer 42 may be formed by a local oxidation of silicon process (LOCOS).

The top gate dielectric 36 is formed over the mesa source, channel and drain, 22, 24 and 26, and formed over both the top and vertical side walls of the regions 22, 24 and 26 as shown. The top gate electrode 18, preferably of polysilicon, is formed over the top gate dielectric 36, including the top and vertical side walls of the top gate dielectric 36, as shown. Thus, the top gate electrode 18 extends over the top and side walls of the channel region 24 as does the top gate dielectric, and in combination with bottom gate 20, tends to substantially surround the channel 24 for enhanced operation of the GAA MOSFET. The top gate insulator 38, preferably of oxide is formed over the top gate electrode 18 as well as exposed portions of the top and bottom gate dielectrics 34 and 36. Finally, the conductor 10 connected to the top gate electrode 18, the conductor 12 connected to the bottom gate electrode 20, the conductor 14 connected to the drain region 22, and the conductor 16 connected to the source region 26 are formed and connected through respective insulator contact windows as represented by rectangular criss-crosses in FIG. 1.

Although the present invention has been described in terms of preferred embodiments, it will be obvious to those skilled in the art that alterations and modifications may be made without departing from the invention. Accordingly, it is intended that all such alterations and modifications be included within the spirit and scope of the invention as defined by the following claims.

What is claimed is:

1. A MOSFET device having a gate all around structure for enhanced depletion mode operation, said device comprising:

a semiconductor layer having a source region and a channel region and a drain region, a bottom gate dielectric disposed under said semiconductor layer, a bottom gate electrode disposed under said bottom gate dielectric, said semiconductor layer is not in contact with said bottom gate electrode as separated by said bottom gate dielectric, a top gate dielectric disposed over said drain region and said channel region and said source region of said semiconductor layer, a top gate electrode disposed over said top gate dielectric, said topgate electrode and said channel region and said bottom gate are disposed in alignment with each other, a bottom insulating layer deposited and disposed under said bottom gate electrode and having a flat bottom surface, and a substrate of a semiconductor material having a bulk portion and an insulating oxide layer portion thermally grown from said bulk portion, said insulating oxide layer portion having uniform thickness and a flat top surface which is bonded to said flat bottom surface of said bottom insulating layer creating a flat planar interface therebetween.

2. The MOSFET device of claim 1 wherein said semiconductor layer is mesa etched creating semiconductor layer side walls to define a semiconductor top of said semiconductor layer, said top gate dielectric is disposed over the semiconductor layer to cover said semiconductor top and said semiconductor side walls and over said bottom gate dielectric, said top gate dielectric then having top gate dielectric side walls covering said semiconductor side walls, said top gate dielectric and said bottom gate dielectric surrounding a top and a bottom and two side walls of said channel region disposed between said source region and said drain region, said top gate electrode is disposed over said top gate dielectric to cover said top gate dielectric and said top gate dielectric side walls, and over said bottom gate dielectric separating said top gate electrode and said bottom gate electrode.

3. The MOSFET device of claim 1 wherein top gate electrode disposed above said channel region and said bottom gate electrode disposed below said channel region are connected together through windows in said bottom gate dielectric along both sides of said channel region to create a true gate all around device.

4. The device of claim 1 wherein said semiconductor layer is a surviving portion of an etched back SOI substrate.

5. The MOSFET device of claim 1 further comprising a top gate insulator layer disposed over said top gate electrode and over remaining exposed portions of said bottom gate dielectric, and four conductors respectively connecting through said top gate insulator to said source region through said top gate dielectric, to said drain region through said top gate dielectric, to said bottom gate electrode through said bottom gate dielectric and to said top gate electrode.

6. The MOSFET device of claim 5 wherein two of said four conductors respectively connected to said top gate electrode and said bottom gate electrode are connected together.

\* \* \* \* \*